United States Patent [19]

Ueno

[11] Patent Number: 5,346,838

[45] Date of Patent: Sep. 13, 1994

[54] METHOD FOR FABRICATING AN INSULATED GATE CONTROL THYRISTOR

[75] Inventor: Katsunori Ueno, Kawasaki, Japan

[73] Assignee: Fuji Electric Co., Ltd., Kawasaki, Japan

[21] Appl. No.: 141,924

[22] Filed: Oct. 28, 1993

Related U.S. Application Data

[62] Division of Ser. No. 846,046, Mar. 5, 1992, Pat. No. 5,281,833.

[30] Foreign Application Priority Data

Mar. 14, 1991 [JP] Japan .................... 3-48490

[51] Int. Cl.$^5$ ............................. H01L 21/00
[52] U.S. Cl. ............................. 437/7; 437/6; 437/50; 437/152; 437/154
[58] Field of Search .......... 437/6, 44, 149, 150, 437/154, 911, 7, 50, 59, 152; 148/DIG. 126

[56] References Cited

U.S. PATENT DOCUMENTS

| | | | |
|---|---|---|---|
| 4,458,408 | 7/1984 | Alonas et al. | 437/6 |
| 5,030,581 | 7/1991 | Yakushiji | 437/6 |
| 5,155,569 | 10/1992 | Terashima | 357/38 |
| 5,194,394 | 3/1993 | Terashima | 437/6 |
| 5,278,076 | 1/1994 | Darwish | 437/6 |
| 5,286,981 | 2/1994 | Lilja et al. | 437/6 |

FOREIGN PATENT DOCUMENTS

| | | | |
|---|---|---|---|
| 0159883 | 12/1979 | Japan | 437/6 |
| 0084173 | 5/1982 | Japan | 437/6 |
| 2241827 | 9/1991 | United Kingdom | 437/6 |

OTHER PUBLICATIONS

"The MOS-Gated Emitter Switched Thyristor" B. Jayant Baliga, Electron Device Letters, vol. 11, No. 2 (Feb. 1990), pp. 75–77.

"MOS Control Thyristors (MCT'S)" V. A. K. Temple, IEDM (1984), pp. 282–285.

"The MOS Depletion-Mode Thyristor: A New MOS-Controlled Bipolar Power Device" Baliga et al., IEEE ELECTRON DEVICE LETTERS, vol. 9, No. 8, Aug. 1988, pp. 411–413.

*Primary Examiner*—Tom Thomas
*Assistant Examiner*—Tuan Nguyen
*Attorney, Agent, or Firm*—Spencer, Frank & Schneider

[57] ABSTRACT

An insulated gate control thyristor including an n-type base region, an insulating layer, gates formed on the insulating layer, first and second windows formed in the insulating layer, p-type emitter layers and n-type cathode layers diffused into the base region from the first windows, and p-type collector layers diffused into the base region from the second windows. The emitter layer and the collector layer are disposed in close proximity to each other under the gate so that a channel is formed which is conducted when the thyristor is turned off. The turn-off of the thyristor speeds up and becomes reliable, and the quality control of the process steps for fabricating the thyristor becomes easier.

4 Claims, 4 Drawing Sheets

METHOD FOR FABRICATING AN INSULATED GATE CONTROL THYRISTOR

This is a division of application Ser. No. 07/846,046 filed Mar. 5th, 1992; now U.S. Pat. No. 5,281,833.

BACKGROUND OF THE INVENTION

1. Field of the Invention

The present invention relates to an insulated gate control thyristor which can be turned on and off by means of a control voltage applied to the gate thereof.

2. Description of the Prior Art

As a thyristor that can be turned off by the gate voltage, GTO (Gate Turn-Off) thyristors are well-known. The GTOs, however, have a low gate input impedance, and hence, require a considerable amount of gate current to turn off. For this reason, by utilizing a high input impedance insulated gate like that of a MOS structure, and by employing the semiconductor integrated circuit technique, various attempts have been made to fabricate thyristors that can turn off a large amount of current and have a relatively high withstanding voltage. This type of thyristor is known as an MCT (MOS Controlled Thyristor).

A typical conventional MCT will be described with reference to FIGS. 1A and 1B. FIG. 1A is a cross-sectional view showing a structure of an MCT unit, and FIG. 1B is a circuit diagram illustrating an equivalent circuit of the MCT unit.

A wafer or a semiconductor body 10 for the MCT is usually formed by growing an n-type epitaxial layer (a base region) 12 on a p-type substrate (an anode region) 11. On the surface of the body 10, a very thin insulating layer 13 such as a gate oxide film is formed, and then, gates 20 made of polysilicon or the like are formed in such a manner that the gates are in parallel with a narrow window W extending in the direction normal to the sheet of FIG. 1A. After that, a p-type emitter layer 30 of a considerable depth, an n-type cathode layer 40, and shallow p-type source layers 80 are embedded into the epitaxial layer (base region) 12, as shown in FIG. 1A, by the ion implantation of impurities from the surface the epitaxial layer 12 using portions of the gates 20 as masks, followed by the annealing of the impurities. Subsequently, insulating films 14 covering the gates 20 are formed on top of the gates, and then, an electrode film 15 making ohmic contact with the cathode layer 40 as well as with the source layer 80 is formed in the window W. In addition, an electrode film 17 making ohmic contact with the substrate 11 is formed on the bottom of the semiconductor body 10.

Thus, a four layer pnpn structure, which characterizes the thyristor and comprises the p-type substrate 11, the epitaxial layer 12, the p-type emitter layer 30, and the cathode layer 40, is formed on the semiconductor body 10. Further, an anode terminal A is led from the electrode film 17 making ohmic contact with the substrate 11, a cathode terminal C is led from the electrode film 15 shortcircuiting the cathode layer 40 and the source layer 80 on their surfaces, and a gate terminal G is led from the gate 20 at a cross-section different from that of FIG. 1A. Incidentally, the substrate 11 serves as the p-type anode region in the thyristor structure. In general, the unit structure shown in FIG. 1A are repeated a number of times in the lateral direction so as to form one MCT.

As shown in an equivalent circuit of FIG. 1B, the MCT includes a-pnp transistor 61 and an npn transistor 62. The pnp transistor 61 comprises the n-type epitaxial layer 12 functioning as the base between the anode region 11 and the emitter region 30, whereas the npn transistor 62 comprises the p-type emitter layer 30 functioning as the base between the n-type epitaxial layer 12 and the cathode layer 40. In addition, as shown in FIG. 1B, the MCT includes an n-channel MOS transistor 71 connected in parallel with the npn transistor 62, and a p-channel MOS transistor 72 formed between the p-type emitter layer 30 and the cathode terminal C. More specifically, as seen in FIG. 2 which is a partially enlarged cross-sectional view in the vicinity of the gate 20, the n-channel MOS transistor 71 is formed between the n-type epitaxial layer 12 and the cathode layer 40 in such a way that its channel CH1 is formed in the surface of the p-type emitter layer 30 under the gate 20, and the p-channel MOS transistor 72 is formed between the p-type emitter layer 30 and the source layer 80 in such a way that its channel CH2 is formed in the surface of the n-type cathode layer 40 under the gate 20.

The MCT is turned on as follows by supplying the gate terminal G with a control voltage positive with regard to the cathode terminal C. First, the control voltage conducts the MOS transistor 71, and then the pnp transistor 61 is turned on by its base current induced by the conductive MOS transistor 71. This in turn induces the base current of the transistor 62, which turns on the npn transistor 62, thereby turning on the MCT. At the start of the turn-on action, the epitaxial layer 12 serves as the base region of the transistor 61 into which the base current is injected. Although it is necessary to inject electrons into the base region 12 through the channel CH1 of the MOS transistor 71 to turn on the MCT, once the MCT has turned on, the MCT maintains its on state even after the control voltage applied to the gate 20 has been removed. This is because a current i, which flows from the anode terminal A to the cathode terminal C across the anode region 11, epitaxial layer 12, emitter layer 30 and the cathode layer 40 as shown in FIG. 2, supplies both transistors 61 and 62 with their base currents so as to maintain their on state.

The MCT is turned off as follows by a negative control voltage applied to the gate terminal G. The negative control voltage conducts the MOS transistor 72, which divides the current i flowing from the transistor 61 to the transistor 62 so as to induce a current ib flowing through the channel CH2 of the MOS transistor 72 as shown in FIGS. 1B and 2. This results in a shortage of the base current of the transistor 62, thereby turning off the MCT.

Prior art insulated gate control thyristors, which includes the above-described MCT as a typical example, can be turned on and off by temporarily supplying their high input impedance gates with positive or negative control voltages. In addition, they have high withstanding voltages of several hundred Volts and large current capacities of several tens of Amperes, and since they are thyristors, they have small on-state voltage drops on the order of magnitude of those of diodes. The conventional insulated gate control thyristors, however, have problems in that the turn-off characteristics are insufficient, and the diffusion process of the semiconductor layers is not easy. These problems are explained below.

First, the turn-off problem will be explained. To turn off the MCT, the current i injected into the emitter layer 30, must be extracted from the cathode terminal C by way of the channel CH2 of the MOS transistor 72 and the cathode layer 80 by conducting the MOS transistor 72, as shown in FIG. 2. In this case, the current ib divided and extracted is only a part of the current i. Accordingly, if the divided ratio is insufficient, and hence, the recovery of the junction between the emitter layer 30 and the cathode layer 40 is delayed, the turn-off time is lengthened, or the turn-off cannot be achieved in the worst case. Furthermore, since an inner resistance 31 of the emitter layer 30 is interposed on the way of the divided current ib, as shown in FIG. 2, the potential under the electrode film 15 for the cathode terminal C becomes higher than the potential in the close proximity to the channel CH2. This induces a junction voltage between the emitter layer 30 and the cathode layer 40, and hence, holes are injected into the cathode layer 40 from the emitter layer 30 owing to the junction voltage. In response to this, electrons are reinjected from the cathode layer 40 into the emitter layer 30, which constitutes the base current of the transistor 62 as shown in FIG. 1B. This makes it difficult to turn off the transistor 62, and hence, to turn off the thyristor.

In a fabrication aspect, the problem is that considerably deep diffusion of a semiconductor double layer is needed which is composed of two reversal conductivity type layers, the emitter layer 30 and the cathode layer 40. The diffusion depth of the emitter layer 30 and the cathode layer 40 must be precisely controlled because it directly relates to the lengths of the channels CH1 and CH2. Furthermore, the impurity concentrations of the emitter layer 30 and the cathode layer 40 must be approximately equal so that the threshold values of the MOS transistors 71 and 72 of FIG. 1B will agree. It is difficult, however, to match the impurity concentrations of the two layers of the reversal conductivity type double layer, and further, to precisely control the diffusion depth of the double layer in the wafer process, which results in variations of products.

Furthermore, the depth of the base region 12 of FIG. 1A determines the withstanding voltage of the transistor 61, and accordingly, that of the thyristor. This depth of the base region 12 must be increased by a considerable amount because the semiconductor double layer of the emitter layer 30 and the cathode layer 40 must be diffused into that region 12. The depth of the base region 12, however, greatly effects the characteristics of the thyristor: the switching speed decreases as the thickness of the base region 12 increases; and the on-state resistance of the thyristor increases in rough proportion to the thickness of the base region 12.

SUMMARY OF THE INVENTION

Accordingly, it is an object of the present invention to provide an insulated gate control thyristor and method for fabricating the same, which eliminates the above-described disadvantages associated with the conventional techniques to improve the turn-off dynamic characteristic with maintaining the advantage of the high input impedance inherent to insulated gate control thyristors, and to facilitate the quality control of the wafer process in the fabrication.

In a first aspect of the present invention, there is provided an insulated gate control thyristor comprising:
an anode region of a first conductivity type;
a base region of a second conductivity type forming a junction with the anode region;
an insulating layer formed on a surface of the base region;
a plurality of gates disposed on the insulating layer;
a plurality of first windows formed in the insulating layer;
a plurality of second windows formed in the insulating layer;
a plurality of emitter layers of the first conductivity type, each of which is diffused into the base region from each one of the first windows;
a plurality of cathode layers of the second conductivity type, each of which is diffused into each one of the plurality of emitter layers;
a plurality of collector layers of the first conductivity type, each of which is diffused into the base region from each one of the second windows;
an anode terminal connected to the anode region;
a cathode terminal connected to the plurality of cathode layers and to the plurality of collector layers; and
a gate terminal connected to the plurality of gates,
wherein the thyristor is turned on and off by a control voltage applied to the gate terminal.

Here, the plurality of first windows and the plurality of second windows may be arranged in stripe-like patterns in such a manner that each one of the plurality of gates is adjacent to one of the plurality of first windows and to one of the plurality of second windows.

The plurality of first windows and the plurality of second windows may be arranged in stripe-like patterns in such a manner that a combination of two of the plurality of first windows and one of the plurality of second windows is repeated in lateral directions on the surface of the insulating layer, and that each window of one of the combination is adjacent to each one of the plurality of gates.

An interval between two adjacent first windows of the combination may be longer than an interval between adjacent first and second windows of that combination.

Each of the plurality of emitter layers may be disposed under each one of the plurality of first windows, and each of the collector layer may be disposed under each one of the plurality of second windows.

The thyristor may be turned on by applying the control voltage of a first polarity to the gate, and may be turned off by applying the control voltage of a second polarity to the gate.

The anode region may be a substrate made of a semiconductor wafer, and the base region may be an epitaxial layer grown on the substrate.

Each of the plurality of emitter layers and each of the plurality of cathode layers may be diffused into the base region from each one of the plurality of first windows by using the plurality of gates as a mask, and each of the plurality of collector layers may be diffused into the base region from each one of the plurality of second windows by using the plurality of gates as a mask.

Each of the plurality of emitter layers and each of the plurality of collector layers may be diffused into the base region from the first and second windows, respectively, to substantially identical depth.

Each of the plurality of cathode layers may be diffused thinly into each one of the plurality of emitter layers.

In a second aspect of the present invention, there is provided a method for fabricating an insulated gate control thyristor comprising the steps of:

forming an anode region of a first conductivity type;

forming a base region of a second conductivity type to produce a junction with the anode region;

forming an insulating layer on a surface of the base region;

forming a plurality of gates on the insulating layer;

forming a plurality of first windows and a plurality of second windows in the insulating layer in such a manner that each one of the plurality of first windows and each one of the plurality of second windows are adjacent to each one of the plurality of gates;

forming a plurality of emitter layers by diffusing impurities of the first conductivity type into the base region from the plurality of first windows;

forming a plurality of cathode layers by diffusing impurities of the second conductivity type into the plurality of emitter layers;

forming a plurality of collector layers by diffusing impurities of the first conductivity type into the base region from the plurality of second windows;

connecting an anode terminal to the anode region;

connecting a cathode terminal to the plurality of cathode layers and to the plurality of collector layers; and connecting a gate terminal to the plurality of gates.

Steps of forming the plurality of emitter layers, forming the plurality of collector layers and forming the plurality of cathode layers may include an annealing process which is carried out at the same time.

In a third aspect of the present invention, there is provided a method for fabricating an insulated gate control thyristor comprising the steps of:

forming an anode region of a first conductivity type;

forming a base region of a second conductivity type to produce a junction with the anode region;

forming an insulating layer on a surface of the base region;

forming a plurality of gates on the insulating layer;

forming a plurality of first windows and a plurality of second windows in the insulating layer in such a manner that one of the plurality of first windows, one of the plurality of gates, one of the plurality of second windows, one of the plurality of gates, one of the plurality of first windows and one of the plurality of gates are disposed successively;

forming a plurality of emitter layers by diffusing impurities of the first conductivity type into the base region from the plurality of first windows;

forming a plurality of cathode layers by diffusing impurities of the second conductivity type into the plurality of emitter layers;

forming a plurality of collector layers by diffusing impurities of the first conductivity type into the base region from the plurality of second windows;

connecting an anode terminal to the anode region;

connecting a cathode terminal to the plurality of cathode layers and to the plurality of collector layers; and connecting a gate terminal to the plurality of gates.

The width of each gate between the plurality of first windows may be longer than that of each gate between one of the plurality of first windows and one of the plurality of second windows.

The present invention is conceived by giving attention to the conventional problem that the current flowing in the emitter layer during the turnoff operation is extracted from the source layer, which is embedded in the surface of the cathode layer under the window of the gate, through the channel in the surface of the cathode layer. Instead of this, the present invention replaces the source layer with the collector layer endbedded in the surface of the base region under the second window of the gate. The current flowing in the emitter layer during the turn-off is extracted from the collector layer through the channel formed in the base region. This increases the extraction effect of the current, and hence, improves the turn-off characteristic of the thyristor. In addition, this obviates the deep diffused cathode layer of the prior art, thereby facilitating the wafer process.

In accordance with the teachings of the present invention:

(1) The turn-off speed of the thyristor can be improved. This is because the current flowing in the emitter layer during the turn-off is extracted from the collector layer through the short channel in the base region under the gate, and in addition, the current flowing in the base region is directed to the collector layer to be extracted therefrom, thereby enhancing the current extraction effect necessary for the turn-off.

(2) The diffusion step of the semiconductor layers in the wafer process can be simpler than that of the conventional technique in which the double diffusion of two different conductivity type layers, namely, the deep emitter layer and the considerably deep cathode layer, was carried out from the same window. This is because the emitter layer and the collector layer of the present invention can be simultaneously diffused into the base region from the first window and the second window of the gate, respectively. As a result, the control accuracy of the impurity concentration and the diffusion depth can be improved, thereby decreasing the variations in the turn-on and turn-off characteristics of the thyristors.

(3) The switching-speed of the thyristor can be increased, and the on-state resistance thereof can be reduced. This is because the base region can be thinner than that of the prior art since deep diffusion of the emitter layer and the collector layer into the base region is not necessary.

The above and other objects, effects, features and advantages of the present invention will become more apparent from the following description of the embodiments thereof taken in conjunction with the accompanying drawings.

DETAILED DESCRIPTION OF PREFERRED EMBODIMENTS

Figure 1A:
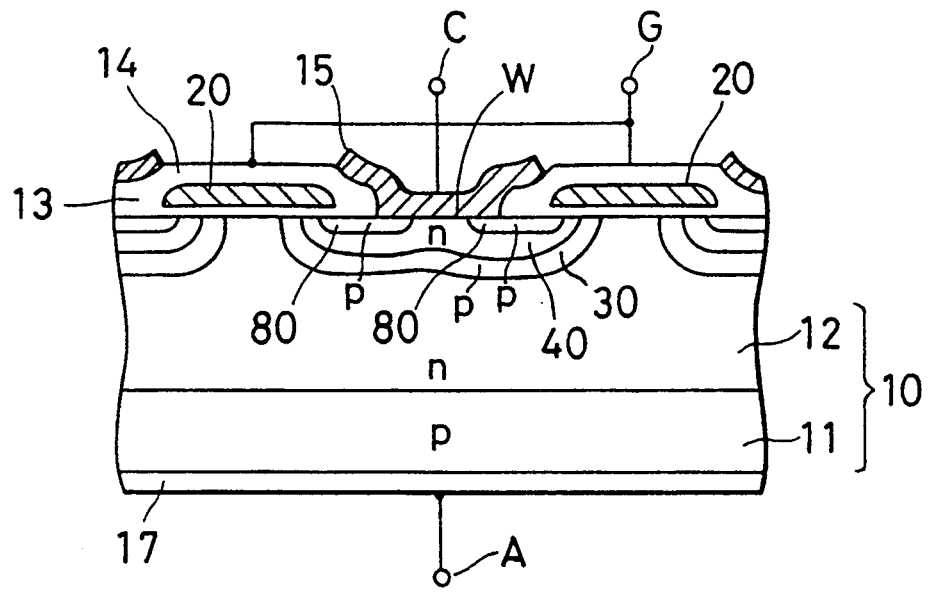
FIG. 1A is a cross-sectional view showing an arrangement of a conventional insulated gate control thyristor or MCT (MOS controlled transistor)
Figure 1B:
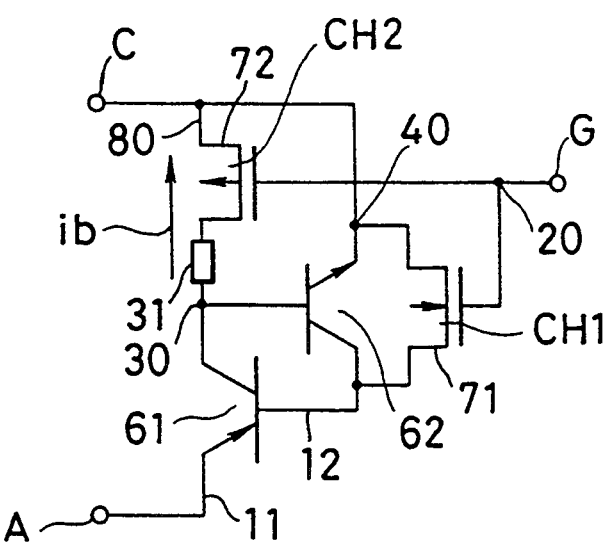
FIG. 1B is a diagram illustrating an equivalent circuit of the thyristor of FIG. 1A.
Figure 2:
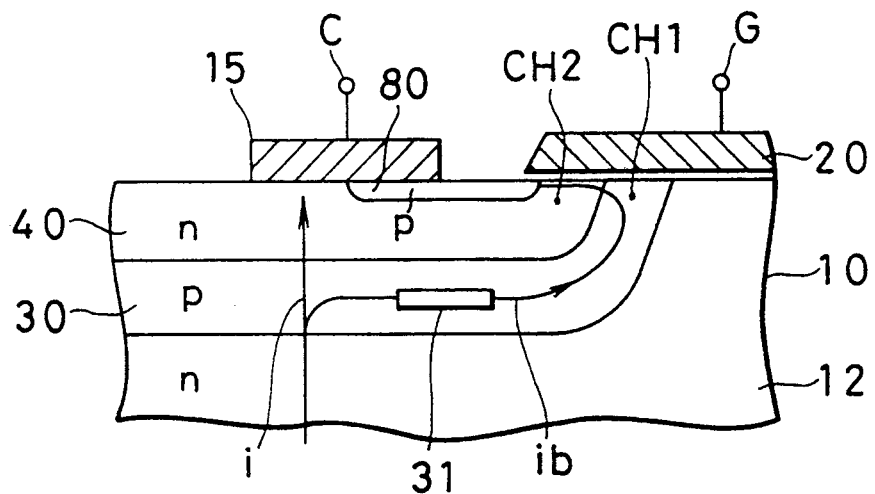
FIG. 2 is an enlarged cross-sectional view showing a major portion of the thyristor of FIG. 1A to illustrate the problem of the prior art.
Figure 3:
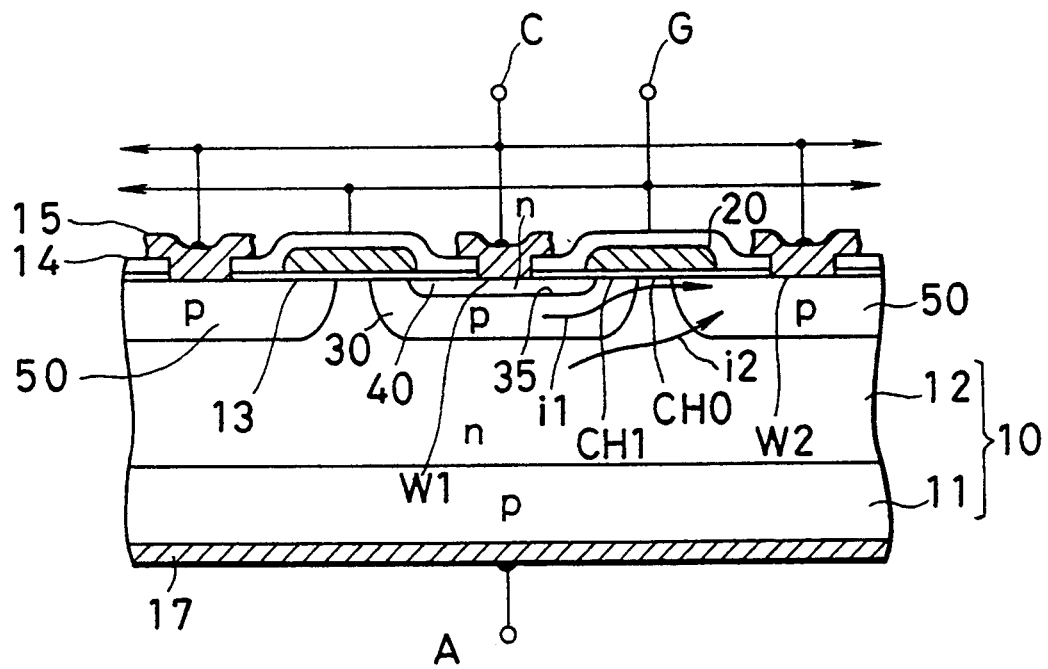
FIG. 3 is a cross-sectional view showing an arrangement of a first embodiment of an insulated gate control thyristor of the present invention.
Figure 4:
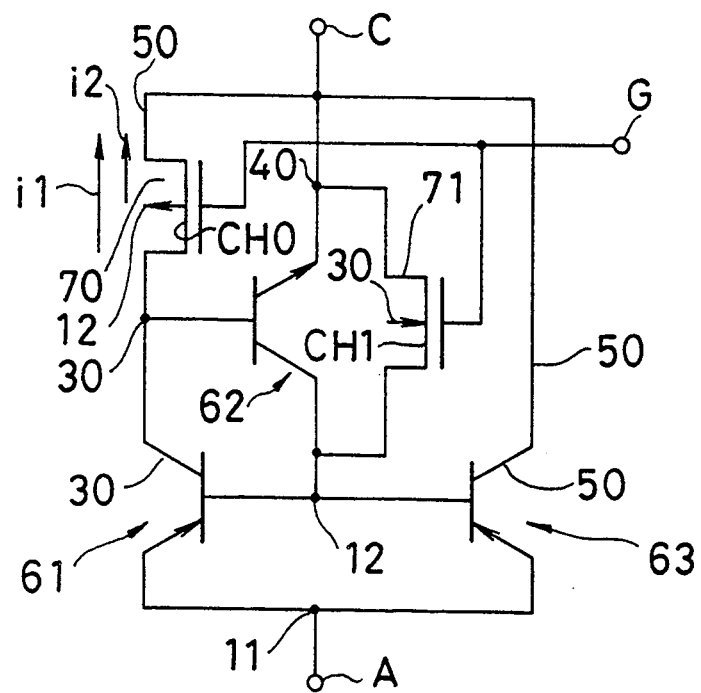
FIG. 4 is a diagram illustrating an equivalent circuit of the insulated gate control thyristor of FIG. 3.
Figure 5:
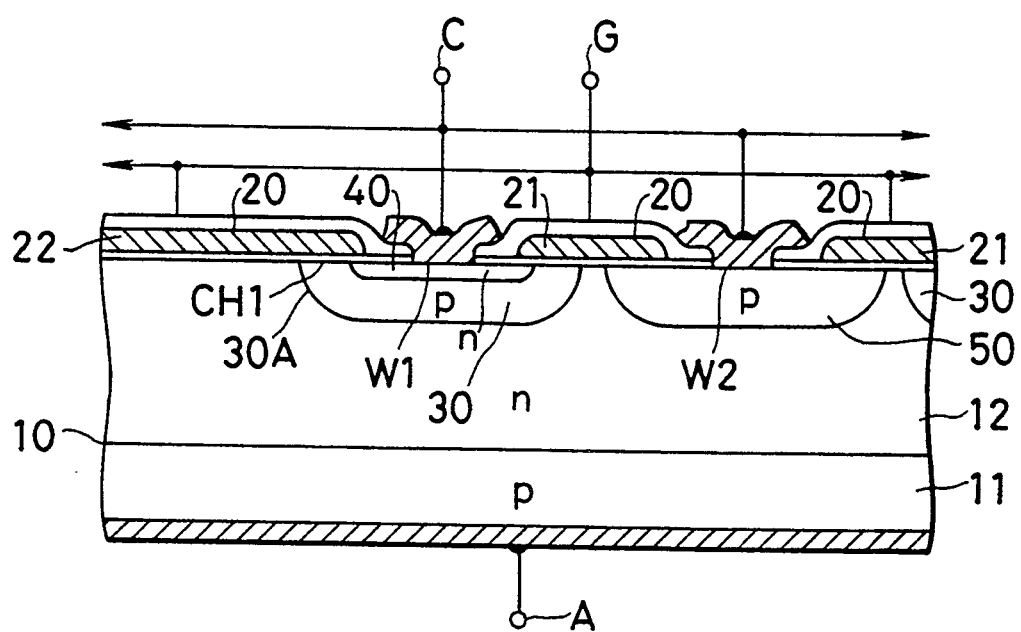
FIG. 5 is a cross-sectional view showing an arrangement of a second embodiment of an insulated gate control thyristor of the present invention.

The invention will now be described with reference to the accompanying drawings. FIGS. 3 and 5 shows a first and a second embodiments of insulated gate control thyristors according to the present invention, respectively, and FIG. 4 illustrates an equivalent circuit of both embodiments. In these figures, like or corresponding parts to those of FIGS. 1A, 1B and 2 are designated by the same reference numerals.

FIRST EMBODIMENT

FIG. 3 is a cross-sectional view showing a unit structure of the first embodiment: a real insulated gate control thyristor whose current capacity is on the order of several tens of Amperes includes a plurality of the unit structures which are repeated in the lateral directions in FIG. 3, and which are connected in parallel fashion. A wafer or a semiconductor body 10 of this embodiment comprises a p-type substrate of a high impurity concentration functioning as an anode region 11, and an n-type epitaxial layer grown on the p-type substrate as a base region 12 . The anode region 11 is about 50 $\mu$m thick and has a resistivity of approximately 30–40 $\Omega$-cm. p After forming a thin gate oxide layer or an insulating layer 13 of 500–1000 Å thickness by oxidizing the surface of the wafer 10 at 1000° C., for 1–2 hours, in an oxidation furnace, each gate 20 is patterned by growing polysilicon film or the like over the entire surface of the wafer 10, and then by carrying out reactive ion etching by using $CCl_4$ and $Cl_2$ on the polysilicon film to form patterns covering substantially the entire surface of each chip. Subsequently, a plurality of narrow, stripe-like windows are formed in the direction normal to the sheet of FIG. 3. In this first embodiment, alternate first and second windows W1 and W2 are formed in such a manner that each of the windows W1 and W2 is a few micrometers to ten micrometers wide, and adjacent windows are each spaced approximately the same distance apart.

Each gate 20 patterned on the base region 12 serves as a mask for the p-type impurity implantation followed by the annealing to form an emitter layer 30 and a collector layer 50. The impurity implantation is performed using boron as the p-type impurity at the energy of 100 keV, followed by the annealing at 1100° C.–1150° C., for several hours, to a depth of several micrometers. These layers 30 and 50 are simultaneously embedded to the depth of 3–5 $\mu$m in the base region 12 under the first window W1 and the second window W2, respectively, and have impurity concentration of about $10^{17}$–$10^{18}$ atoms/cm$^3$. After that, an n-type cathode layer 40 is formed in the emitter layer 30 under the first window W1 to the depth of about 1 $\mu$m or less. The cathode layer 40 has an impurity concentration of about $10^{19}$ atoms/cm$^3$. Incidentally, n-type impurities such as arsenic have slower diffusion rate than p-type impurities such as boron. For this reason, using these impurities makes it possible to anneal the cathode layer 40 simultaneously with the emitter layer 30 and the collector layer 50.

After that, the surface of the wafer 10 is covered by an insulating film 14 composed of phosphosilicate glass or the like. Subsequently, contact windows are defined and etched in the insulating film 14, and electrode films 15 and 17 composed of aluminum or the like are deposited and patterned on both surfaces of the wafer 10, so that an anode terminal A, a cathode terminal C, and a gate terminal G are led out of the anode region 11, the cathode layer 40 and the collector layer 50, and the gate 20, respectively. In this case, the gate terminal G is led out of a cross-section different from that of FIG. 3. A complete insulated gate control thyristor is a square chip whose side is a few millimeter long, and has current capacity of several tens of Amperes. Incidentally, the top electrode film 15 is usually formed as a continuous film like the bottom electrode film 17, though only portions of the electrode 15 making contact with the semiconductor layers are illustrated in FIG. 3 for simplicity of the drawing.

The operation of the insulated gate control thyristor having the above-described arrangement will be described with reference to an equivalent circuit shown in FIG. 4. This equivalent circuit differs from that of FIG. 1B in that a transistor 63 is connected between the anode terminal A and the cathode terminal C, and in that the MOS transistor 72 in FIG. 1B is replaced with a MOS transistor 70. The transistor 63 is a pnp-type transistor comprising a p-type anode region 11, an n-type base region 12 and a p-type collector layer 50. The MOS transistor 70 is a p-channel type which has a channel CH0 induced in the surface of the n-type base region 12 under the gate 20, between the p-type emitter layer 30 and the collector layer 50 .

The insulated gate control thyristor is turned on by conducting the n-channel MOS transistor 71, that is, by conducting the channel CH1 at the surface of the emitter 30 under the gate 20 by applying a positive control voltage to the gate terminal G in FIG. 3. Thus, electrons are injected into the base region 12 from the cathode layer 40 through the channel CH1, which in turn causes the base current to be injected into the base region 12 from the anode region 11, thereby turning on the pnp transistors 61 and 63. This causes the npn transistor 62 to be turned on, thereby turning on the insulated gate control thyristor and maintaining its conductive state after the control voltage has been removed.

In contrast, the insulated gate control thyristor is turned off by conducting the p-channel MOS transistor 70 by applying a negative control voltage to the gate terminal G. This causes the current in the emitter layer 30 to flow toward the collector layer 50 through the channel CH0, thereby reducing the base current of the transistor 62. As a result, the transistor 62 is turned off, followed by the turning off of the transistors 61 and 63, resulting in the turning off of the insulated gate control thyristor.

During the turn-off operation, the current flowing to the collector layer 50 passes two different passages as shown in FIG. 3: a current i1 flows from the emitter layer 30 to the collector layer 50 through the channel CH0; and a current i2 flows directly from the base region 12 to the collector layer 50. This facilitates the extraction of the current from the cathode terminal C connected to the collector layer 50, and reduces the base current to be extracted from the emitter layer 30, that is, reduces the base current flowing into the inner resistance 31 from the base of the transistor 62. Consequently, the inner resistance 31 existing in the emitter layer 30 as shown in FIG. 1B can be ignored, and hence, the voltage rise in the emitter layer 30 immediately under the cathode layer 40 is restricted to a small value. This will reduce the reinjection of electrons across the junction 35 between the cathode layer 40 and the emitter layer 30, thereby increasing the turn-off speed. Furthermore, it is unnecessary to form the channel CH2 at the surface of the cathode layer 40 as in FIG. 2. This makes it possible to increase the impurity concentration of the cathode layer 40 to about $10^{19}$ atoms/cm$^3$ as mentioned before, and hence, to improve the recovery of the junction 35 between the emitter layer 30 and the cathode layer 40, thus further speeding up the turn off.

In the present invention, the length of the channel CH0 formed in the surface of the base region 12 under the gate 20 can be reduced to approximately 1 $\mu$m by controlling the diffusion depth of the emitter layer 30 and the collector layer 50, and accordingly, by controlling the lateral diffusion length of these layers. This makes it possible to reduce the on-state resistance of the MOS transistor 70, and hence, to further facilitate the extraction of the current from the emitter layer 30, thereby further speeding up the turn off. Excessive reducing of the channel length, however, will hinder the turn on of the thyristor. This is because the voltage applied to the thyristor during the off-state grows a depletion layer near the channel CH0 in the base region 12 when the channel length of the channel CH0 is reduced too much, and the depletion layer hinders the current from flowing through the channel CH1 when the MOS transistor 71 is to be conducted to turn on the thyristor. A second embodiment of the present invention shown in FIG. 5 is proposed to eliminate this problem.

SECOND EMBODIMENT

Figure 6A:
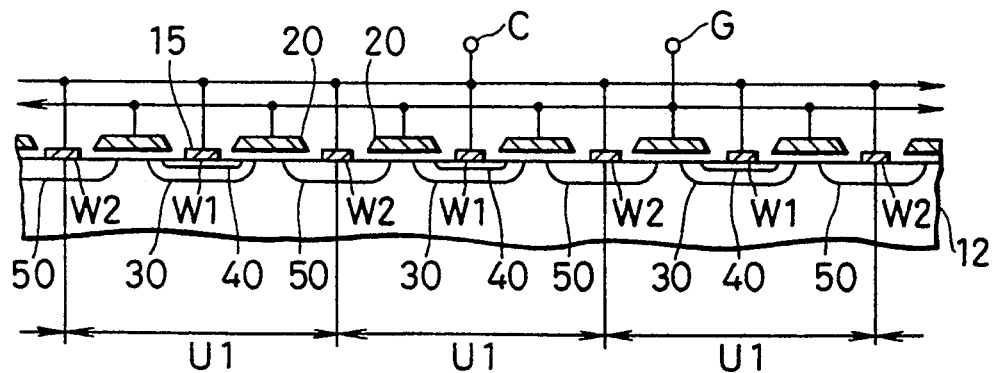
FIG. 6A is a schematic cross-sectional view showing first and second windows adjacent to the gate and the related semiconductor layers of the first embodiment shown in FIG. 3.
Figure 6B:
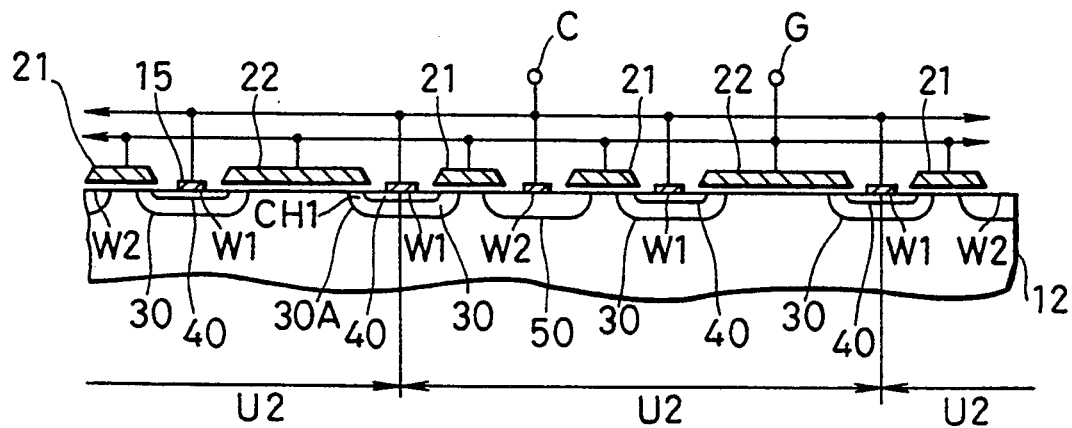
FIG. 6B is a schematic cross-sectional view showing first and second windows adjacent to the gate and the related semiconductor layers of the second embodiment shown in FIG. 5.

FIG. 5 shows about half of a unit structure of a thyristor of the second embodiment of the present invention, and FIGS. 6A and 6B are schematic cross-sectional view contrastively showing the structure of the thyristors of the first and second embodiments, respectively. In these figures, the unit structure of the first and second embodiments are indicated by U1 and U2, respectively, and the width of the unit structure U2 of the second embodiment is about double that of the unit structure U1 of the first embodiment.

The second embodiment is similar to the first embodiment in that it includes a first window W1 and a second window W2, but is different in the following: The first embodiment illustrated in FIG. 6A has the first and second windows W1 and W2 alternately provided adjacent to the gate 20, and includes the emitter layer 30 and the collector layer 50 alternately disposed correspondingly to these windows W1 and W2. In contrast, the second embodiment illustrated in FIG. 6B has two first windows W1 and one second window W2 alternately provided adjacent to a gate 20 so that two narrow gates 21 and one wide gate 22 are alternately disposed as the gate 20, and includes two emitter layers 30 and one collector layer 50 alternately disposed correspondingly to the windows W1 and W2.

Thus, in the second embodiment, the first and second windows W1 and W2 are spaced different intervals apart as shown in FIG. 6B, and two emitter layers 30 are disposed immediately next to one collector layer 50.

Under the narrow gates 21, the edges of the collector layer 50 are located close to the edges of the adjacent emitter layers 30 so that they are only about 1 $\mu$m apart, whereas under the wide gate 22, the edges of the two adjacent emitter layers 30 are spaced wide apart.

Another difference of the second embodiment from the first embodiment is that the impurity concentration of the emitter layer 30 is preferably reduced to approximately $10^{16}$–$10^{17}$ atoms/cm$^3$. The remaining portions and an equivalent circuit of the second embodiment are similar to those of the first embodiment.

In the second embodiment as shown in FIG. 5, the growth of a depletion layer into a base region 12 from the left-hand edge 30A of the emitter layer 30 of FIG. 5 is reduced, that is, from the edge not immediately next to the collector layer 50. This makes it easy for a current to flow through the channel CH1 in the left top surface of the emitter 30, thereby facilitating the turning on of the thyristor. In this case, the length of the surface of the base region 12 under the gate 22 must be longer than 5–10 $\mu$m. Although this reduces the availability of the chip area by a small amount, the insulated gate control thyristor of the second embodiment can balance turn-on and turn-off characteristics.

EMBODIMENT 3

Figure 7:
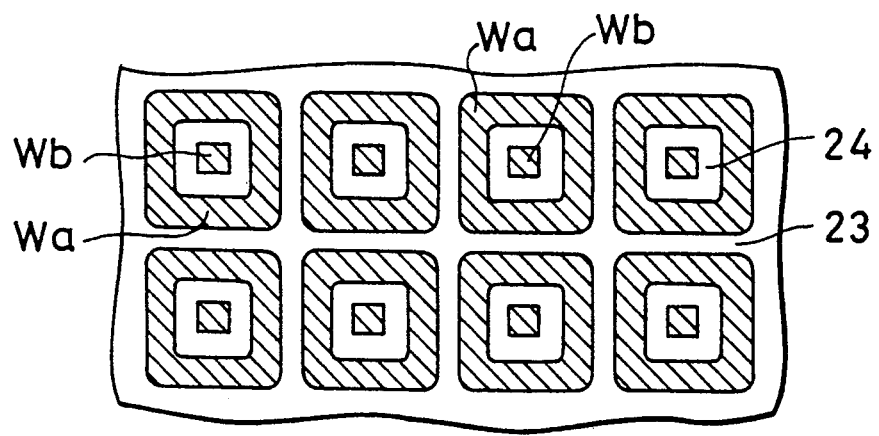
FIG. 7 is a plan view showing an example of an arrangement of first and second windows of a third embodiment according to the present invention.

FIG. 7 is a plan view showing a third embodiment of an insulated gate control thyristor of the present invention. In the first and second embodiments of the present invention, the stripe-like windows W1 and W2 in the gate 20 are arranged in one dimension. In the third embodiment, however, cell-like windows are patterned in two dimensions: ring-like windows Wa are disposed in a lattice arrangement, and island-like windows Wb are disposed in a two dimensional arrangement as shown in FIG. 7 so that lattice-like gates 23 and ring-like gates 24 are formed as gates.

The third embodiment can be modified to the first embodiment by using the windows Wa as the first windows W1 and the windows Wb as the second windows W2, and to the second embodiment by using the windows Wb as the first windows W1 and the windows Wa as the second windows W2 with enlarging size of the gate 24.

Although specific embodiments of an insulated gate control thyristor constructed in accordance with the present invention have been disclosed, it is not intended that the invention be restricted to either the specific configurations or the uses disclosed herein. Modifications may be made in a manner obvious to those skilled in the art. For example, the semiconductor regions and layers may have opposite conductivity types, and the values of the impurity concentration and sizes are shown only as examples and can be suitably chosen as needed.

Accordingly, it is intended that the invention be limited only by the scope of the appended claims.

What is claimed is:

1. A method for fabricating an insulated gate control thyristor comprising the steps of:
   forming an anode region of a first conductivity type;
   forming a base region of a second conductivity type to produce a junction with said anode region;
   forming an insulating layer on a surface of said base region;
   forming a plurality of gates on said insulating layer;
   forming a plurality of first windows and a plurality of second windows in said insulating layer in such a manner that each one of said plurality of first windows and each one of said plurality of second windows are adjacent to each one of said plurality of gates;

forming a plurality of emitter layers by diffusing impurities of the first conductivity type into said base region from said plurality of first windows;

forming a plurality of cathode layers by diffusing impurities of the second conductivity type into said plurality of emitter layers;

forming a plurality of collector layers by diffusing impurities of the first conductivity type into said base region from said plurality of second windows;

connecting an anode terminal to said anode region;

connecting a cathode terminal to said plurality of cathode layers and to said plurality of collector layers; and connecting a gate terminal to said plurality of gates.

2. A method for fabricating an insulated gate control thyristor as claimed in claim 1, wherein steps of forming said plurality of emitter layers, forming said plurality of collector layers and forming said plurality of cathode layers include an annealing process which is carried out at the same time.

3. A method for fabricating an insulated gate control thyristor comprising the steps of:

forming an anode region of a first conductivity type;

forming a base region of a second conductivity type to produce a junction with said anode region;

forming an insulating layer on a surface of said base region;

forming a plurality of gates on said insulating layer;

forming a plurality of first windows and a plurality of second windows in said insulating layer in such a manner that one of said plurality of first windows, one of said plurality of gates, one of said plurality of second windows, one of said plurality of gates, one of said plurality of first windows and one of said plurality of gates are disposed successively;

forming a plurality of emitter layers by diffusing impurities of the first conductivity type into said base region from said plurality of first windows;

forming a plurality of cathode layers by diffusing impurities of the second conductivity type into said plurality of emitter layers;

forming a plurality of collector layers by diffusing impurities of the first conductivity type into said base region from said plurality of second windows;

connecting an anode terminal to said anode region;

connecting a cathode terminal to said plurality of cathode layers and to said plurality of collector layers; and connecting a gate terminal to said plurality of gates.

4. A method for fabricating an insulated gate control thyristor as claimed in claim 3, wherein a width of each gate between said plurality of first windows is longer than that of each gate between one of said plurality of first windows and one of said plurality of second windows.

* * * * *